United States Patent [19]

Do et al.

[11] Patent Number: 5,349,659
[45] Date of Patent: Sep. 20, 1994

[54] HIERARCHICAL ORDERING OF LOGICAL ELEMENTS IN THE CANONICAL MAPPING OF NET LISTS

[75] Inventors: Cuong Do, San Jose; Ruey-Sing Wei, Fremont, both of Calif.

[73] Assignee: Cadence Design Systems, Inc.

[21] Appl. No.: 824,599

[22] Filed: Jan. 23, 1992

[51] Int. Cl.$^5$ .............................................. G06F 15/60
[52] U.S. Cl. ..................... 395/700; 364/282.1; 364/283.1; 364/DIG. 2; 364/917.96
[58] Field of Search ............... 364/488, 489, 490, 491; 395/700

[56] References Cited

U.S. PATENT DOCUMENTS

| | | | |
|---|---|---|---|
| 4,377,849 | 4/1983 | Finger et al. | 364/491 |
| 4,613,940 | 6/1986 | Shenton et al. | 364/490 |
| 4,831,543 | 7/1989 | Mastellone | 364/489 |
| 4,949,275 | 3/1990 | Nonaka | 364/490 |
| 5,201,039 | 11/1993 | Sakamura | 395/375 |

OTHER PUBLICATIONS

Baugh, et al.; "Optimal Networks of NOR-OR Gates for Functions of Three Variables"; IEEE Transactions on Computers; vol. C-21, No. 2; Feb. 1972, pp. 153-160.
Chen, et al.; "Hierarchical functional verification for Cell-Based Design Styles"; IEE Proceedings; vol. 134, pt. G, No. 2; Apr. 1987; pp. 103-109.

Primary Examiner—Gareth D. Shaw
Assistant Examiner—Jonathan Aloha Backenstose
Attorney, Agent, or Firm—Kenneth M. Kaslow; Phong K. Truong; Dennis S. Fernandez

[57] ABSTRACT

A system and method are described for decreasing the synthesis time required for realizing digital circuit net lists using library logic elements. The system consists of a logic processor working in concert with a cell library register, a hierarchical cell array memory, and a match register, for the purpose of hierarchically ordering, matching and eliminating equivalencies in the canonical forms of library cells. The method includes the reduction of all library elements to their canonical forms and the hierarchical ordering of the these canonicals based on the number of nodes contained in each element. Once ordered, the canonicals are mapped by logic elements having fewer nodes, beginning with the simplest of the canonical forms. Redundantly mapped logical elements are eliminated and the resulting reduced set is stored for subsequent use.

2 Claims, 8 Drawing Sheets

AND5

HIERARCHICAL ORDERING OF LOGICAL ELEMENTS IN THE CANONICAL MAPPING OF NET LISTS

BACKGROUND OF THE INVENTION

1. Field of the Invention

This invention relates to the design of digital logic systems and more particularly to the use of a hierarchically ordered library of canonical digital logic elements to facilitate the design of optimized digital logic systems.

2. Description of the Background Art

In the design of digital logic systems, the reduction of the logic equations to a hardware implementation is referred to as logic synthesis. This synthesis process consists of two discrete steps. The first step involves the optimization of the logic equations into a minimum number of realizable steps. Most digital equations expressed in boolean (binary logic) form are capable of multiple equivalent representations. This optimization process requires that the designer choose among the various forms of the boolean equation, that expression which may be implemented using the fewest gate delays and the least amount of geometrical area or component floor space.

The second step of the logic synthesis process consists of identifying digital components available to the designer which may be used to realize the optimized boolean equation. Each designer has a finite list of components available for implementing the target equation. These components are often stored as design cells in a computer aided design environment. The mapping process involves the substitution by the designer of cell components for terms in the optimized boolean equation. Complicating the efforts of the designer is the usual availability of a variety of cell design implementations from which the designer may choose to implement any given cell function. As the number of available cells in a cell library increases, the various possible implementations of an optimized boolean equation increases exponentially. As in the optimization step above, the designer must choose among the various cell realizations for the implementation which produces the fastest result while using the least amount of geometrical area to build.

A basic tenet of Boolean arithmetic is that any boolean equation may be realized using one or more appropriate combinations of inverters and two input NAND gates (NAND2). It should be noted that inverters and two input NOR (NOR2) gates work equally well, however, NAND2 gates are used throughout this specification to simplify the description. To implement an AND function, for instance, a NAND function is followed by an inverter. This construction of an AND gate using an inverter and a NAND2 gate is referred to as the "canonical form" of the AND function. Library cells consist of components designed and represented in their canonical form.

In order to implement the optimized Boolean function using canonical form cell components, the optimized Boolean function must first be decomposed into a canonical form net list. A typical canonical form net list 14 for a simple boolean equation is shown in FIG. 1. Once the net list 14 is decomposed into a canonical form, the various canonical logic subcomponents available in the cell library are compared with each section of the canonical net list to determine which of the cells will "map" or match with sections of the net list. This mapping of the cell library to the net list is generally very time consuming, particularly since most cell functions have multiple equivalent canonical representations. What is needed is a system for reducing the number of combinations of library cells and net list sections which must be checked.

SUMMARY OF THE INVENTION

In accordance with the present invention, an apparatus and method are described for accelerating the process by which digital electronic circuits are implemented using available library logic cells. The apparatus consists of a logic processor having a net list register, a cell library register, a hierarchical cell array memory and a match register. The logic processor begins the component reduction process by reducing all logic elements stored in the cell library register to their canonical forms. These canonicals are then stored in the hierarchical cell array memory where they are ordered based on the number of nodes contained in each element. The processor then maps each logical element having fewer nodes onto logical elements having more nodes, beginning with the logical element having the fewest number of nodes. The processor then eliminates redundantly mapped elements and stores the hierarchical ordering to permanent memory for subsequent use.

DESCRIPTION OF THE PREFERRED EMBODIMENT

Figure 1:
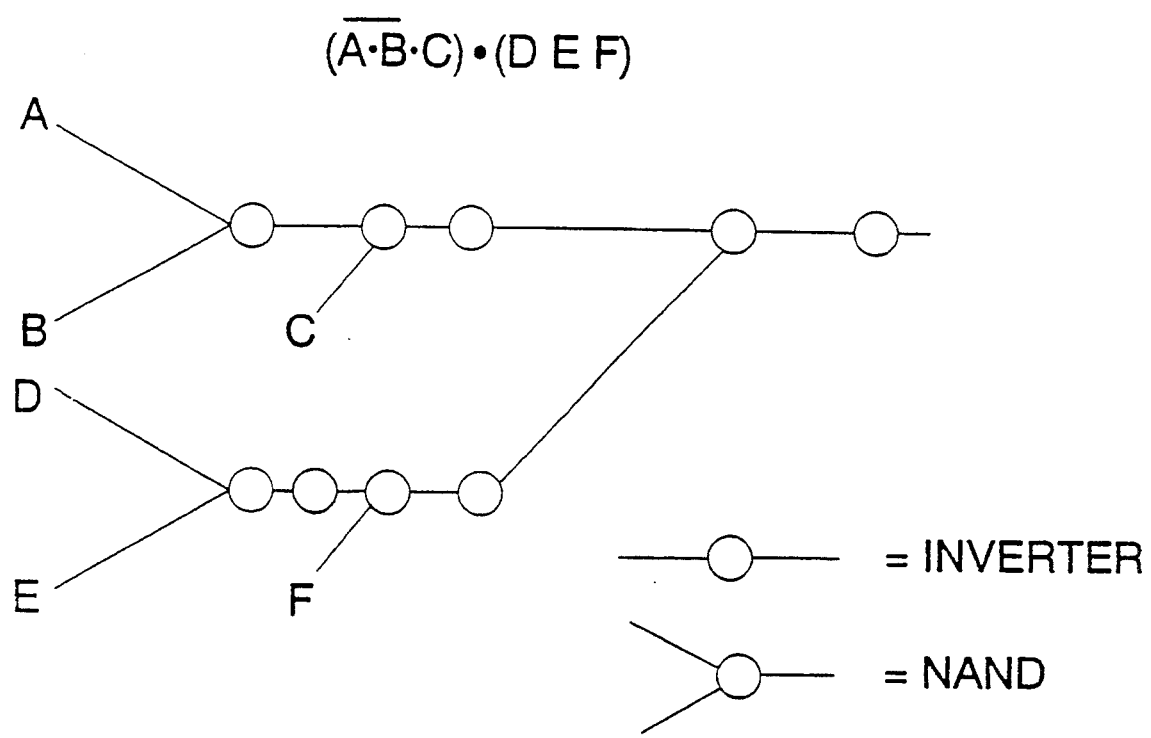
FIG. 1 is a typical canonical-form net list for a simple boolean equation.
Figure 2:
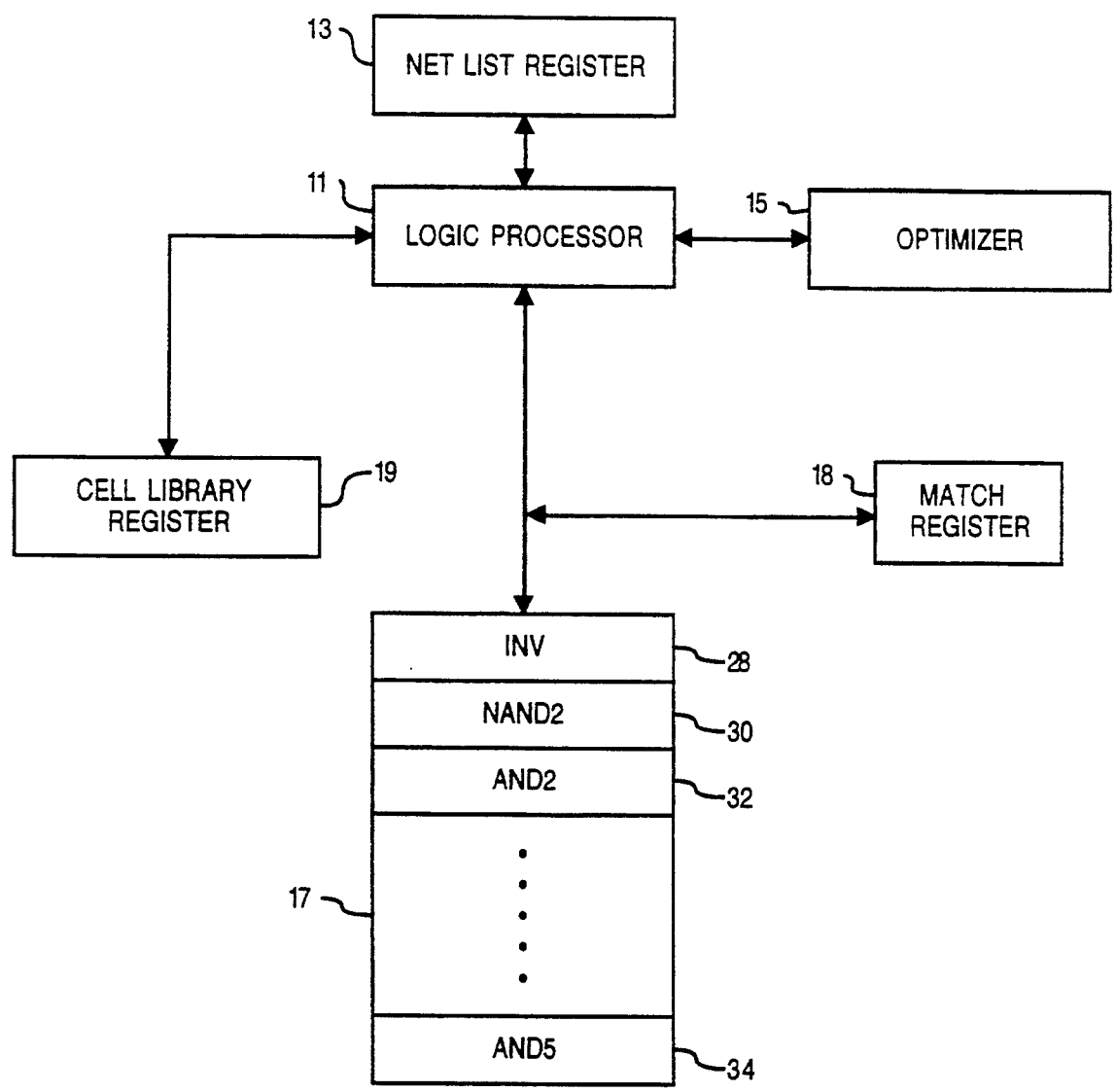
FIG. 2 is a block diagram representing the logic synthesis system of the present invention.

Referring now to FIG. 2, logic processor 11 is shown connected to net list register 13, cell library register 19, optimizer 15, match register 18 and hierarchical cell array 17. Net list register 13 stores node and connectivity information relating to the electronic digital circuit being synthesized. Cell library register 19 contains an array of library cells maintained within the synthesis system 10. These library cells are building blocks used by the circuit designer in constructing digital circuits and are often uniquely suited for the manufacturing process or application for which the circuit is targeted. A typical cell library, for instance, may contain OR gates, AND gates, XOR gates, multiplexor gates, buffers, flip flops, an inverter and the like. Circuit design time can be greatly reduced by constructing circuits composed of predesigned and tested library cells. Hierarchical cell array 17 is a listing of the cells contained within cell library register 19 ranked in order of canonical complexity. Optimizer 15 is used in conjunction with logic processor 11 to replace net list elements in the original digital circuit design with the most cost efficient combination of cell library register 19 components. Match register 18 is utilized by logic processor 11 to store the identities of canonical equivalents of various library cells within hierarchical cell array 17. The matching of canonical equivalents is described in greater detail below.

Figure 3:
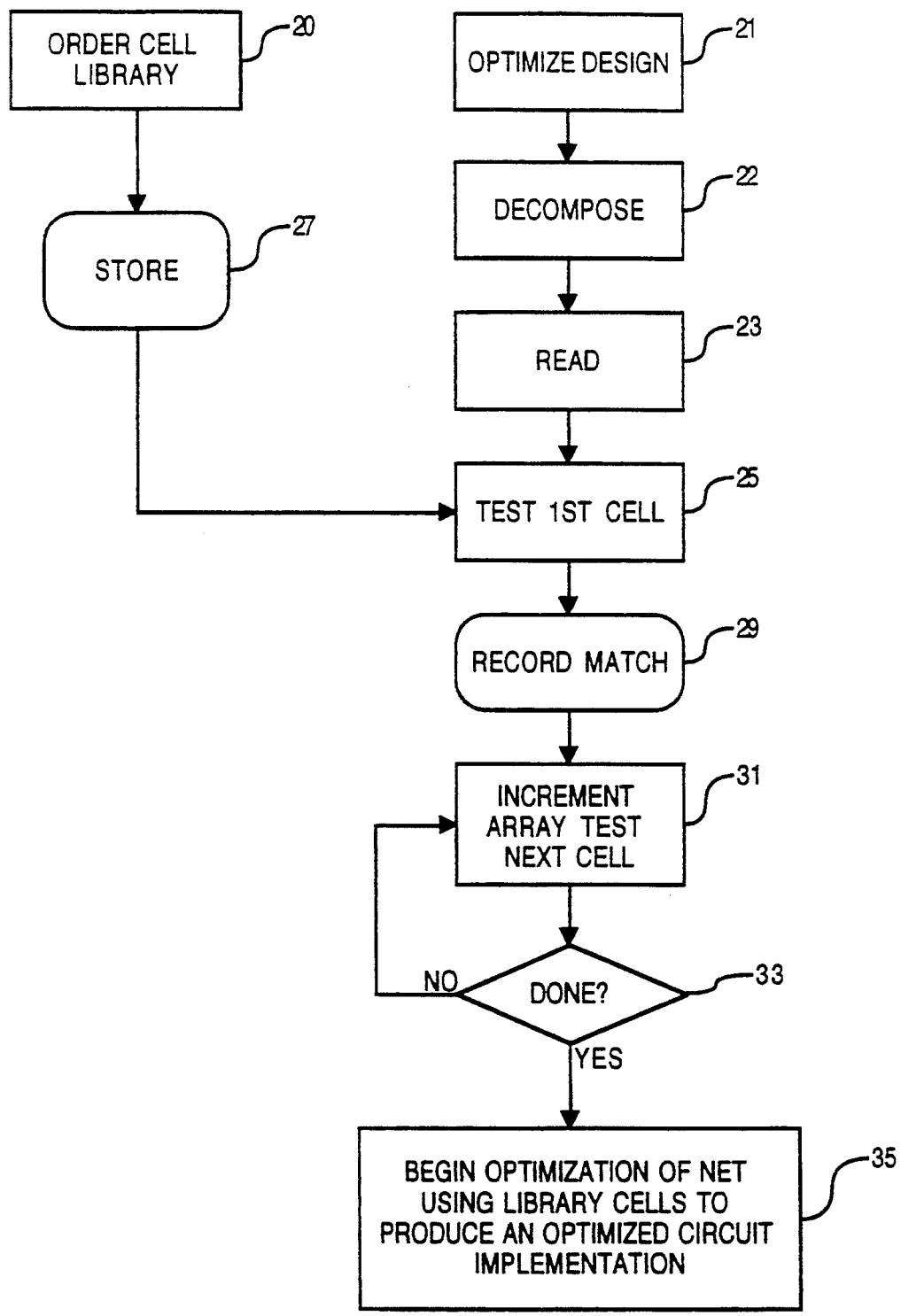
FIG. 3 is a block diagram showing a preferred method of efficiently implementing digital circuit designs using library cells.

Referring now to FIG. 3, the logic circuit designer begins the implementation process by first optimizing the boolean logic circuit representation in step 21. The need for optimizing the logical implementation of the circuit design results from the fact that most circuits can be realized by a variety of circuit topologies. These circuit topologies, although having equivalent functionality, may have differing "costs" associated with them, where cost is based on the number of circuit delay gates and the amount of circuit board or silicon space required in their realization. Various techniques for topological optimization are well known, including the use of matrix reduction methods and a variety of heuristic and mathematical techniques utilizing digital computers.

Figure 4:
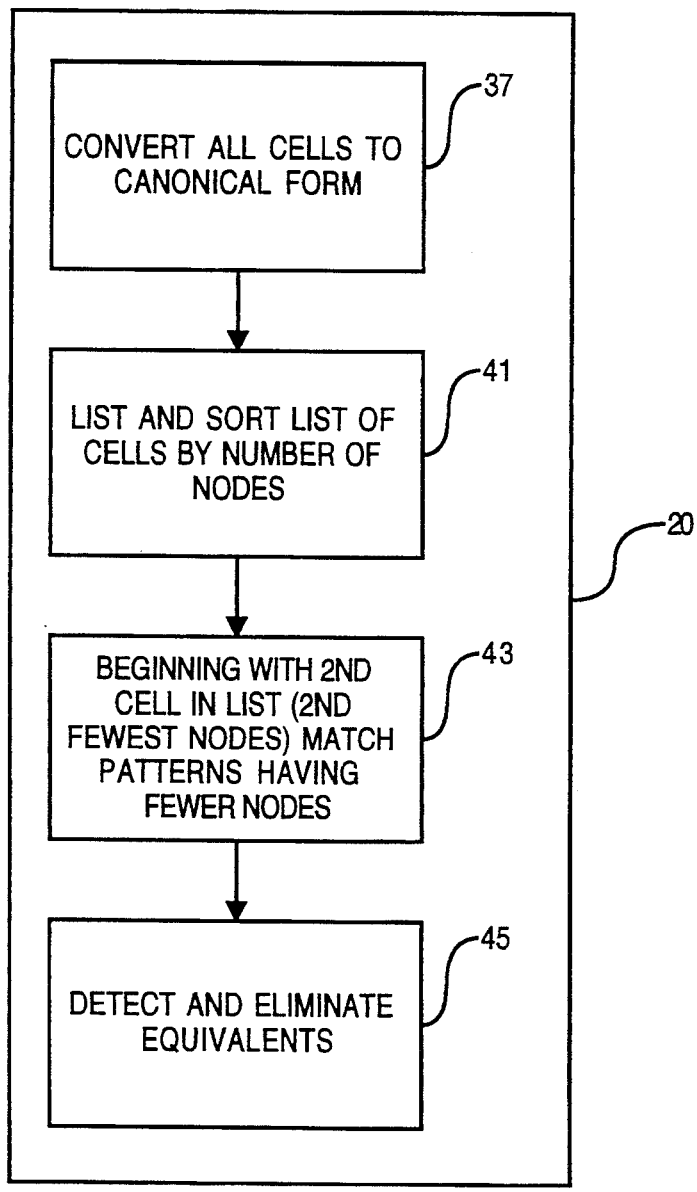
FIG. 4 is a block diagram showing the steps in which library cells are ordered hierarchically in the method of FIG. 3.

Once the logic system is optimized, the user then decomposes the circuit to its canonical net list in step 22. The canonical net list representation consists of the circuit design reduced to an equivalent representation of fundamental building blocks comprising such elements as NAND gates, NOR gates, and inverters (INV). In a separate process, either concurrent with or prior to canonical decomposition, logic processor 11 performs an ordering of the cell library in step 20. This ordering of cell library 19 is shown in greater detail in FIG. 4. The first step of the ordering is to convert all of the cells of library 19 to their possible canonical form as shown in step 37. This decomposition of library cells is similar to the decomposition performed in step 22, except that multiple canonical forms for the same cell may be enumerated. In step 41, the list of the library cell canonical forms stored in cell library register 19 is sorted and ranked by increasing number of nodes and stored in hierarchical cell array 17.

In step 43, logic processor 11 evaluates each ranked library cell produced in step 41 and attempts to redefine it in terms of more basic cell canonical forms within and located lower in the hierarchical cell array 17. For example, the canonical form of a 5-input AND gate (AND5) will be defined in step 43 as the combination of a 4-input AND gate (AND4) and a two input AND gate. Hierarchical cell array 17 typically includes such library cells as INV 28, NAND2 30, and AND2 32. Within this hierarchical cell array 17, the inverter would appear at the top of the hierarchical list having only one node, the two-input NAND gate would have the second fewest elements and would appear second in the hierarchical cell array. The AND gate then could be defined as a combination of the NAND gate and the inverter in step 43, and would be listed third in this example hierarchical cell array 17. The AND5 gate would be redefined as the combination of an AND4 and a two input AND gate, as described above.

Following the matching of step 45, processor 11 compares each canonical cell within hierarchical cell array 17 with all other canonical forms in the array and eliminates equivalencies, so that following this elimination step 45, only a single canonical representation of each cell remains. Subsequently, in step 27, the canonical representation of each cell is stored in hierarchical cell array 17. Since the design optimization process which must ultimately be performed is nonlinearly time dependent on the number of implementation equivalencies available, by eliminating redundant canonical forms, optimization time can be greatly improved.

Figure 5A:
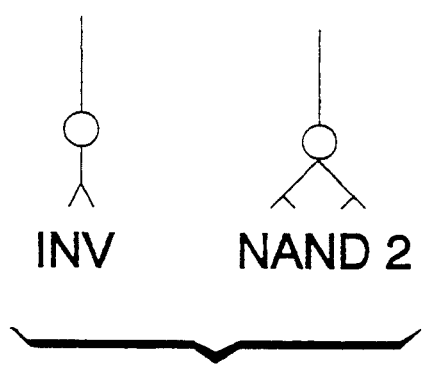
FIG. 5(a) is a graphical representation showing INV and NAND2 library cells.
Figure 5B:
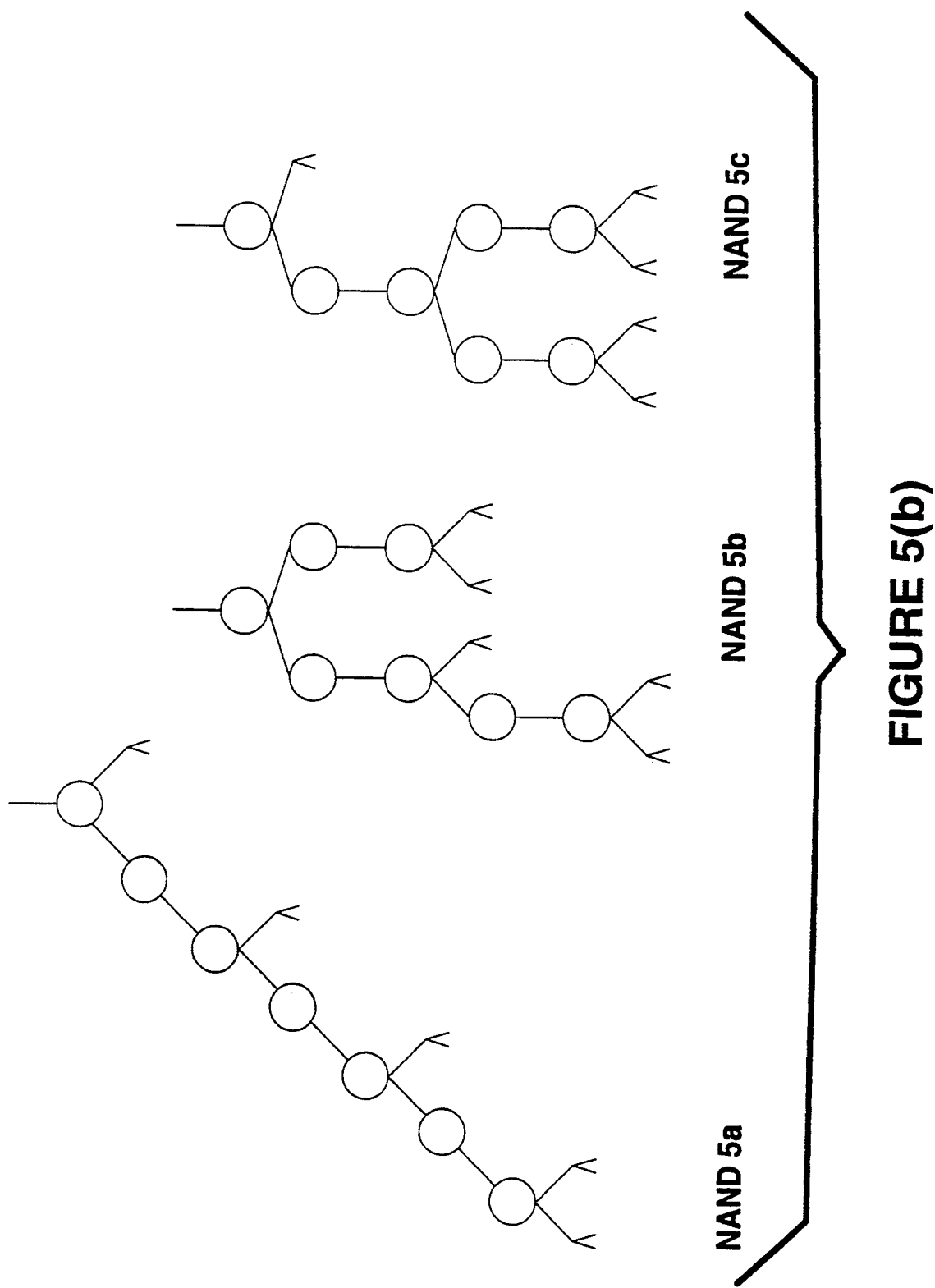
FIG. 5(b) is a graphical representation showing three canonical forms of the NAND5 library cells.
Figure 5C:
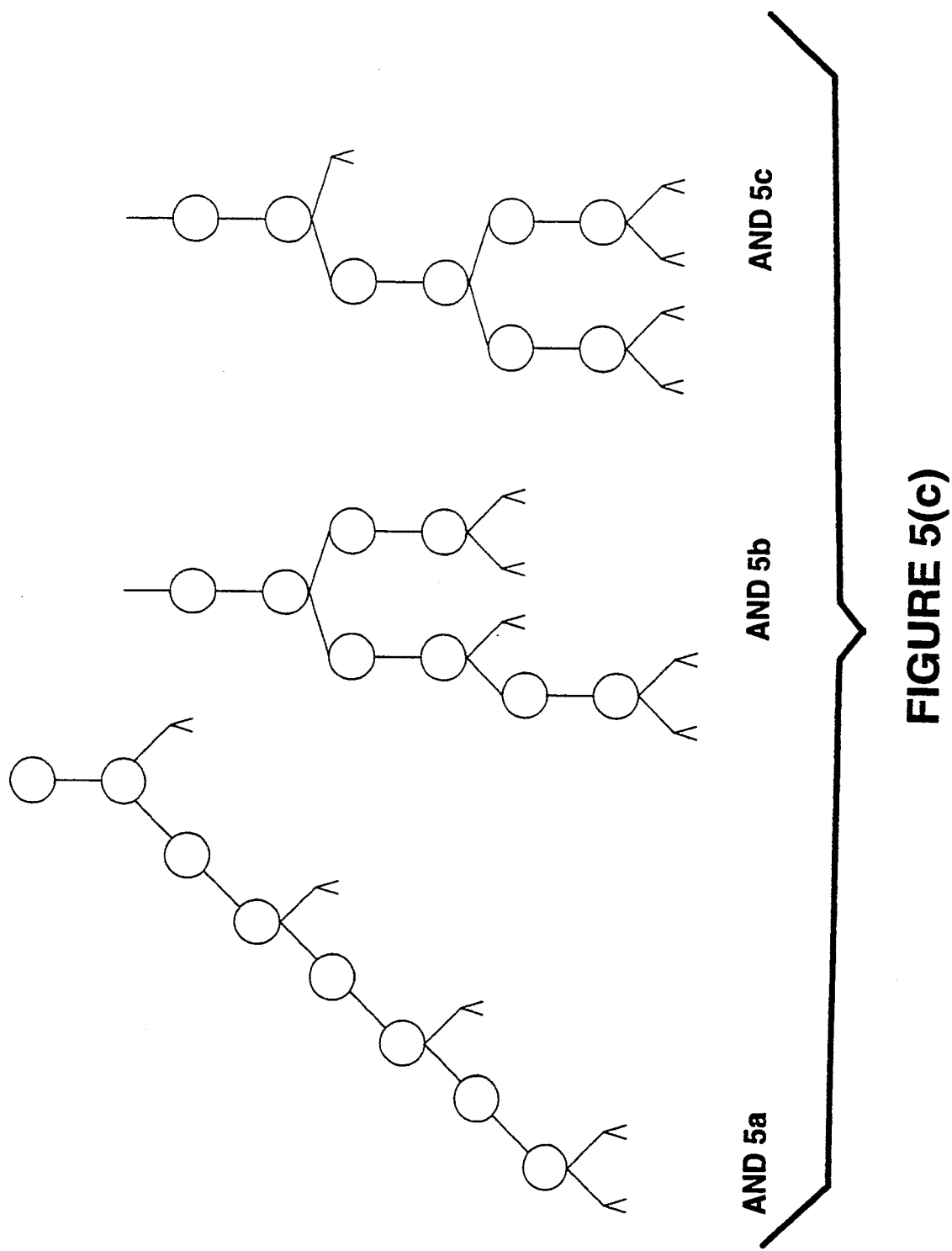
FIG. 5(c) is a graphical representation showing three canonical forms of the AND5 library cells.
Figure 5D:
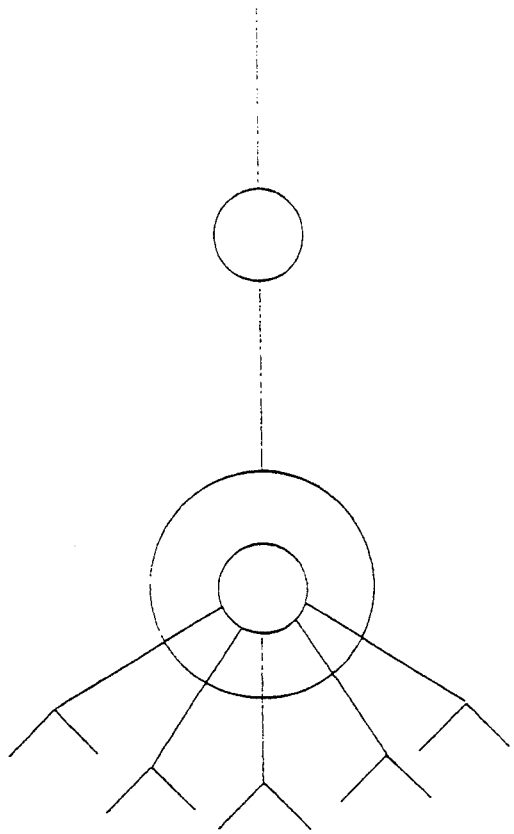
FIG. 5(d) is a graphical representation showing an AND5 gate consisting of a generic NAND5 having an output connected to an INV cell.

In order to more fully illustrate the hierarchical ordering method of the present invention, an example of a typical library reduction is shown in FIGS. 5(a)–(d). For the purposes of this example assume that the cell library contains only four cells: an inverter (INV), a two input NAND gate (NAND2), a five input NAND gate (NAND5), and a five input AND gate (AND5). FIG. 5(a) shows the graphical representations of the INV and NAND2 gates; FIG. 5(b) shows the graphs of three canonical forms of the NAND5 gate, and FIG. 5(c) shows the graphical representaions of the three canonical AND5 forms. The canonical forms of FIGS. 5(b) and 5(c) are generated in step 37. The NAND5 gate has three canonical forms and the AND5 gate has three canonical forms. The list of cells are then sorted by their number of nodes in step 41. The lowest order cell is the INV, with one node, followed by the NAND2 with one node. Each of the three NAND5 cells of FIG. 5(c) has seven nodes, and the AND5 canonical forms each have eight nodes. In step 43, each of the higher order cells are matched with cell patterns having a fewer number of nodes. In step 45, equivalent forms are detected and eliminated to produce a single representative cell for each cell form. FIG. 5(d) shows an AND5 resulting from step 45 represented by a generic NAND5 having an output connected to an INV cell. The generic NAND5 could equivalently be represented by any of the individual NAND5 canonical forms shown in FIG. 5(c).

Referring again to FIG. 3, logic processor 11 reads net list register 13 in step 23 and begins to systematically test all net list nodes against individual cells listed in hierarchical cell array 17. Initially tested is the cell which appears as the first entry in hierarchical cell array 17. Since virtually all cell libraries contain the basic single input and single output inverter 28, this inverter 28 will usually be the first element for which the net list is searched. Logic processor 11 will check each node within the net list and compare each node to the canonical listing for the inverter cell. Each match detected will be recorded in match register 18. Once the entire net list has been checked for inverters 28, the next location in hierarchical cell array 17 will be checked against matches for the net list, just as occurred for the inverter. The next array location shown in FIG. 2, contains a NAND2 gate 30. Each NAND2 gate 30 which occurs within net list register 13 will be detected and recorded in match register 18. This matching and incrementing of hierarchical cell array 17 continues until all cell components of hierarchical cell 17 have been checked against net list register 13.

When net list register 13 has been completely checked, the logic processor turns the checked net list register 13 along with the contents of match register 18 over to optimizer 15 for optimization of the circuit. Optimization is the process by which the most efficient combination of library cells is used to implement a circuit. Efficiency is based on the number of components used, circuit speed and geometric surface area required. Optimizer 15 evaluates each possible combination of hierarchical cell array 17 components which will satisfy the functional design requirement, and determines which combination of cells produces the most efficient digital circuit implementation.

We claim:

1. In a computer automated design system for the design and logic synthesis of electronic circuits, the system comprising a cell library having a plurality of cell components for implementing an electronic circuit in a fabrication technology, each cell component having one or more nodes defined therein, a computer implemented method for hierarchically defining and ordering the cell components, comprising the steps of:

converting each cell component into a canonical form cell component having a number of nodes;

sequentially ordering all of said cell components based on the number of nodes contained in each cell component, with cell components having more nodes being higher in the hierarchy, to create an ordered array of cell components;

for each cell component, hierarchically redefining the selected cell component in terms of cell components lower in the hierarchy than the selected cell component to create a plurality of hierarchical cell components in the ordered array of cell components;

for each hierarchical cell component, comparing the hierarchical cell component with all other hierarchical cell components in the ordered array of cell components to determine whether any other hierarchical cell component is structurally identical to the hierarchical cell component; and eliminating from the ordered array of cell components any other hierarchical cell component which is structurally identical to the hierarchical cell component to ensure that each hierarchical, cell component is structurally distinct.

2. The method of claim 1, further comprising the steps of:

storing all hierarchical cell components remaining in the ordered array of cell components into a hierarchical cell array and;

beginning with a lowest ordered cell component, comparing each cell components in the ordered array of cell components with nodes stored in a net list register, and matching each node stored in the net list register with a selected cell component, such that all nodes in the net list register are matched with selected cell components in the array memory, and such that all matches for a first cell component having a number of nodes are made before any matches are made for a second cell component having a greater number of nodes.

* * * * *